US007803667B2

(12) United States Patent
Shen et al.

(10) Patent No.: US 7,803,667 B2
(45) Date of Patent: Sep. 28, 2010

(54) MANUFACTURING PROCESS FOR A QUAD FLAT NON-LEADED CHIP PACKAGE STRUCTURE

(75) Inventors: Geng-Shin Shen, Tainan County (TW); Chun-Ying Lin, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 201 days.

(21) Appl. No.: 12/270,679

(22) Filed: Nov. 13, 2008

(65) Prior Publication Data

US 2009/0068794 A1 Mar. 12, 2009

Related U.S. Application Data

(63) Continuation-in-part of application No. 11/326,749, filed on Jan. 5, 2006, now Pat. No. 7,560,306.

(30) Foreign Application Priority Data

Jul. 21, 2005 (TW) .............................. 94124656 A

(51) Int. Cl.
*H01L 21/44* (2006.01)

(52) U.S. Cl. ............... 438/126; 257/686; 257/E21.499; 438/108; 438/617

(58) Field of Classification Search ................. 257/686, 257/E21.499; 438/108, 109, 126, 617
See application file for complete search history.

(56) References Cited

U.S. PATENT DOCUMENTS

| | | | | |
|---|---|---|---|---|
| 6,001,671 | A | 12/1999 | Fjelstad | |
| 6,448,506 | B1 | 9/2002 | Glenn et al. | |
| 7,091,581 | B1 | 8/2006 | McLellan et al. | |
| 2002/0039808 | A1 | 4/2002 | Fukutomi et al. | |
| 2006/0223234 | A1 | 10/2006 | Terayama et al. | 438/113 |

FOREIGN PATENT DOCUMENTS

| | | |
|---|---|---|
| CN | 1501488 | 6/2004 |

OTHER PUBLICATIONS

U.S. Office Action of U.S. Appl. No. 11/326,2006, filed Dec. 5, 2008.

*Primary Examiner*—Asok K Sarkar
(74) *Attorney, Agent, or Firm*—J.C. Patents

(57) ABSTRACT

A manufacturing process for a Quad Flat Non-leaded (QFN) chip package structure is provided. First, a conductive layer having recesses and a patterned solder resist layer on the conductive layer are provided, wherein the patterned solder resist layer covers the recesses of the conductive layer. A part of the conductive layer uncovered by the patterned solder resist layer is removed so as to form a patterned conductive layer. Chips are bonded onto the patterned conductive layer such that the patterned solder resist layer and the chips are at the same side of the patterned conductive layer. The chips are electrically connected to the patterned conductive layer by bonding wires, wherein the chips and the bonding wires are at the same side of the patterned conductive layer. At least one molding compound is formed and the molding compound and the patterned conductive layer are separated.

21 Claims, 4 Drawing Sheets

124 112 122 114 120 118 110b 110a 110b 110'

124 140 132 130 112 150 122 114 134 136 120 118 110b 110a 110b 110'

MANUFACTURING PROCESS FOR A QUAD FLAT NON-LEADED CHIP PACKAGE STRUCTURE

CROSS-REFERENCE TO RELATED APPLICATION

This application is a continuation-in-part of U.S. application Ser. No. 11/326,749, filed on Jan. 5, 2006, all disclosure is incorporated therewith. The prior application Ser. No. 11/326,749 claims the priority benefit of Taiwan application serial no. 94124656, filed on Jul. 21, 2005. The entirety of each of the above-mentioned patent applications is hereby incorporated by reference herein and made a part of this specification.

BACKGROUND OF THE INVENTION

1. Field of the Invention

The present invention relates to a manufacturing process for a chip package structure. More particularly, the present invention relates to a manufacturing process for a Quad Flat Non-leaded (QFN) chip package structure.

2. Description of Related Art

The semiconductor industries have bee highly developed. With the trends of electrification, electronic and semiconductor devices are widely used in the daily life, including entertainment, education, transportation and households. The design of the electrical products becomes more complex, smaller-sized, light-weight and humanized, in order to offer more convenience for the consumers. In the package structures, the leadframe is one of the most commonly used elements, applied in various package products. Based on the type of leadframes, the Quad Flat Packages (QFP) can be categorized as quad flat chip package with "I" lead (QFI), quad flat chip package with "J" lead (QFJ) and Quad Flat Non-leaded (QFN) chip package. Because leads of the leadframe in the QFN chip package end at the edges of the chip package structure, the QFN chip package has a small size. Since the QFN chip package provides shorter electrical path and faster signal transmission, the QFN chip package has been widely used as low pin count solutions for power elements.

In general, in the fabricating process of a QFN chip package, a plurality of chips are disposed on the leadframe, wherein the leadframe includes a plurality of lead sets connected to each other and each chip is surrounded by one lead set. Each chip is electrically connected to one lead set through wire bonding. Then, at least one molding compound is formed to encapsulate the leadframe, the chips and the bonding wires. Finally, a plurality of QFN chip packages are formed through a singulation process, wherein the sigulation process includes a punch process or a sawing process.

SUMMARY OF THE INVENTION

The present invention is to provide a manufacturing process for a QFN chip package structure having small thickness.

As embodied and broadly described herein, the present invention provides a manufacturing process for a Quad Flat Non-leaded (QFN) chip package structure. First, a conductive layer having a plurality of recesses and a patterned solder resist layer on the conductive layer are provided, wherein the patterned solder resist layer covers the recesses of the conductive layer. A part of the conductive layer is removed so as to form a patterned conductive layer. A plurality of chips are bonded onto the patterned conductive layer such that the patterned solder resist layer and the chips are at the same side of the patterned conductive layer. The chips are electrically connected to the patterned conductive layer by a plurality of bonding wires, wherein the chips and the bonding wires are at the same side of the patterned conductive layer. At least one molding compound is formed to encapsulate the patterned conductive layer, the patterned solder resist layer, the chips and the bonding wires. Then, the molding compound and the patterned conductive layer are separated.

According to an embodiment of the present invention, a method for providing the conductive layer having a plurality of recesses and the patterned solder resist layer includes providing a conductive layer having a plurality of recesses, forming a solder resist layer on the conductive layer, and patterning the solder resist layer to form the patterned solder resist layer, wherein a part of the conductive layer is exposed by the patterned solder resist layer.

According to an embodiment of the present invention, a plurality of die pads and a plurality of leads are formed on the patterned conductive layer.

According to an embodiment of the present invention, a plurality of first openings and second openings are formed on the patterned solder resist layer, wherein a part of the patterned conductive layer is exposed by the first openings and the second openings.

According to an embodiment of the present invention, the bonding wires are electrically connected to the patterned conductive layer through the first openings.

According to an embodiment of the present invention, chips are bonded onto the patterned conductive layer exposed by the second openings.

According to an embodiment of the present invention, the manufacturing process for a QFN chip package structure further includes forming an adhesive layer between the chips and the patterned conductive layer.

According to an embodiment of the present invention, the adhesive layer is a B-staged adhesive layer.

According to an embodiment of the present invention, the B-staged adhesive layer is formed on a rear surface of the chip in advance.

According to an embodiment of the present invention, the B-staged adhesive layer is formed on the patterned conductive layer before the chip is attached on the patterned conductive layer.

According to an embodiment of the present invention, the recesses are filled with the patterned solder resist layer.

According to an embodiment of the present invention, the conductive layer has a first surface with the recesses and a second surface opposite to the first surface.

According to an embodiment of the present invention, a method for removing a part of the conductive layer to form a patterned conductive layer includes etching a part of the conductive layer from the second surface so as to expose the patterned solder resist layer.

According to an embodiment of the present invention, the patterned solder resist layer is a B-staged layer.

According to an embodiment of the present invention, the patterned solder resist layer is an epoxy molding compound.

According to an embodiment of the present invention, a plurality of first openings are formed on the patterned solder resist layer, wherein a part of the patterned conductive layer are exposed by the first openings.

According to an embodiment of the present invention, the chips are bonded onto the patterned solder resist layer.

According to an embodiment of the present invention, the patterned solder resist layer is a B-staged layer.

According to an embodiment of the present invention, the manufacturing process for a QFN chip package structure further includes forming an adhesive layer between the chips and the patterned solder resist layer.

According to an embodiment of the present invention, the adhesive layer is a B-staged adhesive layer.

In summary, the manufacturing process for the QFN chip package structure of the present invention can produce the QFN chip package having a solder resist layer to enhance the structure strength of the QFN chip package, such that the thickness of the patterned conductive layer can be decreased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
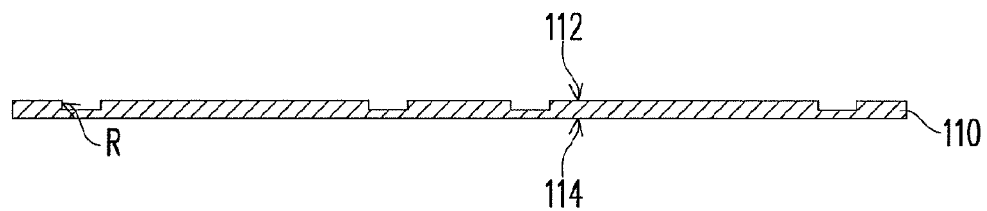
FIG. 1A to FIG. 1H are cross-sectional views schematically illustrating the manufacturing process for the QFN chip package structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1A to FIG. 1H are cross-sectional views schematically illustrating the manufacturing process for the QFN chip package structure according to an embodiment of the present invention. Referring to FIG. 1A, a conductive layer 110 having a first surface 112 and a second surface 114 is provided. Then, the conductive layer 110 at predetermined regions is partially removed such that a plurality of recesses R are formed on the first surface 112 of the conductive layer 110. In the present embodiment, the recesses R on the first surface 112 are formed by a half-etching process or a stamping process.

Figure 1B:
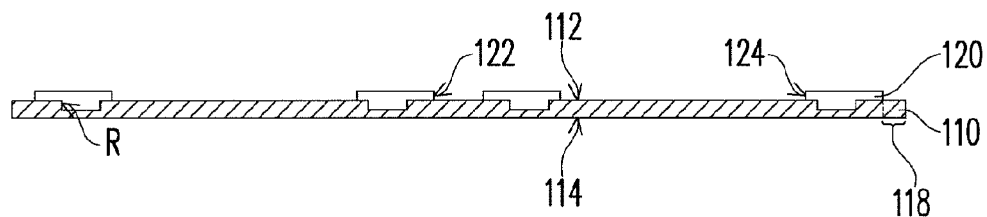

Referring to FIG. 1B, a patterned solder resist layer 120 having a plurality of first openings 122 and a plurality of second openings 124 is formed on the first surface 112 of the conductive layer 110, such that the recesses R formed on the first surface 112 of the conductive layer 110 are filled with the patterned solder resist layer 120. A plurality of first bonding pads 118 are defined by the patterned solder resist layer 120 formed on a part of the first surface 112. In a preferred embodiment, a brown oxidation or a black oxidation process can further be performed on the conductive layer 110 to improve the surface roughness of the conductive layer 110. Accordingly, the combination between the conductive layer 110 and the patterned solder resist layer 120 is improved.

In an alternative embodiment, instead of forming a patterned solder resist layer 120 having a plurality of first openings 122 and a plurality of second openings 124 on the first surface 112 of the conductive layer 110, a patterned solder resist layer (not shown) with a plurality of first openings 122 and without second openings 124 is formed on the first surface 112 of the conductive layer 110.

In the present embodiment, the patterned solder resist layer 120 may be a B-staged film, which is also a solder resist film, and the first openings 122 and the second openings 124 are formed before or after the patterned solder resist layer 120 being attached onto the conductive layer 110. In an alternative embodiment, the patterned solder resist layer 120 may be formed by coating a liquid solder resist on the first surface 112 of the conductive layer 110 first, and the liquid solder resist should be cured and patterned to form the patterned solder resist layer 120 after being coated on the first surface 112 of the conductive layer 110, and the liquid solder resist could be a B-staged liquid solder resist In an alternative embodiment, the patterned solder resist layer 120 further could be formed by pre-molding an epoxy molding compound on the first surface 112 of the conductive layer 110 and the patterned solder resist layer should be cured by a post mold cured process.

Additionally, in a preferred embodiment, a plating process may be performed so as to form a plating conductive layer (not shown) on the first bonding pads 118. The plating conductive layer may be a Ni/Au stacked layer, or other suitable metal layers. It is noted that the plating conductive layer may be formed before or after the patterned solder resist layer 120 is formed on the conductive layer 110.

Figure 1C:
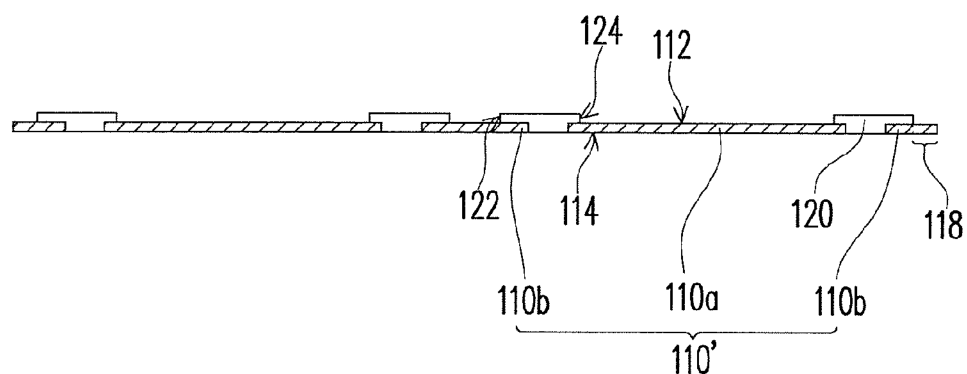

Referring to FIG. 1C, the second surface 114 of the conductive layer 110 is removed by etching to form a patterned conductive layer 110', wherein the patterned conductive layer 110' has a plurality of die pads 110*a* and a plurality of leads 110*b*. The removal of parts of the conductive layer 110 from the second surface 114 is, for example, performed by a backside etching process.

Figure 1D:
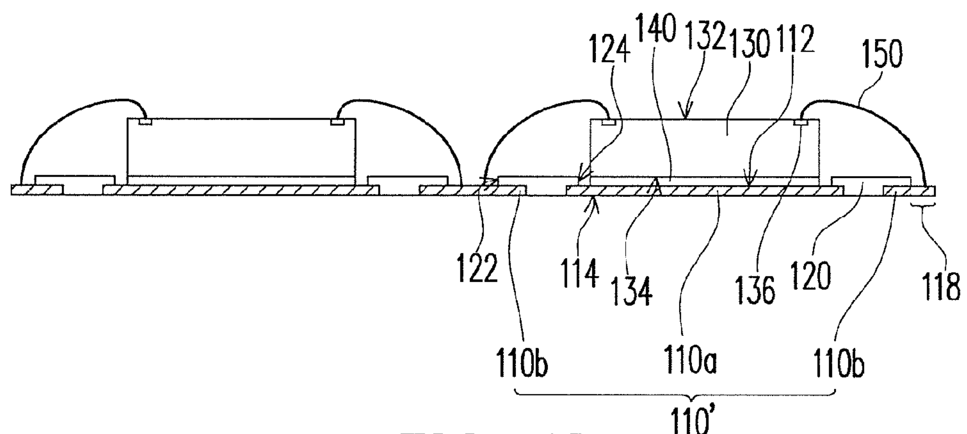

Referring to FIG. 1D, a plurality of chips 130 are adhered to the patterned conductive layer 110' and a plurality of bonding wires 150 are then formed to connect the chips 130 and the patterned conductive layer 110', wherein each chip 130 has an active surface 132, a rear surface 134 opposite to the active surface 132 and a plurality of second bonding pads 136 disposed on the active surface 132. Each chip 130 is adhered on the patterned conductive layer 110' by an adhesive layer 140 between the chip 130 and the patterned conductive layer 110'. In an alternative embodiment, the chips 130 could be adhered on the patterned solder resist layer 120 without the adhesive layer 140, wherein the patterned solder resist layer 120 is a B-staged solder resist layer formed on the leads 110*b* and the die pads 110*a* (such that there is no second opening 124) without being fully cured before the chips 130 are attached.

In the present embodiment, the bonding wires 150 are formed by a wire bonding process, such that each bonding wire 150 is electrically connected between a first bonding pad 118 and a second bonding pad 136. The bonding wires 150 are, for example, Au wires.

In the present embodiment, the adhesive layer 140 is a B-staged adhesive layer, a conductive layer or a non conductive layer, for example. The B-staged adhesive layer can be obtained from 8008 or 8008HT of ABLESTIK. Additionally, the B-staged adhesive layer can also be obtained from 6200, 6201 or 6202C of ABLESTIK, or obtained from SA-200-6, SA-200-10 provided by HITACHI Chemical CO., Ltd. In an embodiment of the present invention, the B-staged adhesive layer 140 is formed on the rear surface of a wafer. When the wafer is separated, a plurality of chip 130 having the adhesive layer 140 on the rear surface 134 thereof is obtained. Therefore, the B-staged adhesive layer 140 is favorable to mass production. Additionally, the B-staged adhesive layer 140 may be formed by spin-coating, printing, or other suitable processes. More specifically, the adhesive layer 140 is formed on the rear surface 134 of the chip 130 in advance. Specifically, a wafer having a plurality of chip 130 arranged in an array is first provided. Then, a two-stage adhesive layer is formed over the rear surface 134 of the chip 130 and is partially cured by heating or UV irradiation to form the B-staged adhesive layer 140. Sometimes, the B-staged adhesive layer 140 could be formed on the patterned conductive layer 110' before the chip 130 being attached on the patterned conductive layer 110'.

In the present embodiment, the B-staged adhesive layer 140 is fully cured after the chip 130 being attached to the patterned conductive layer 110' or later by a post cured or being encapsulated by the molding compound 160.

Figure 1E:
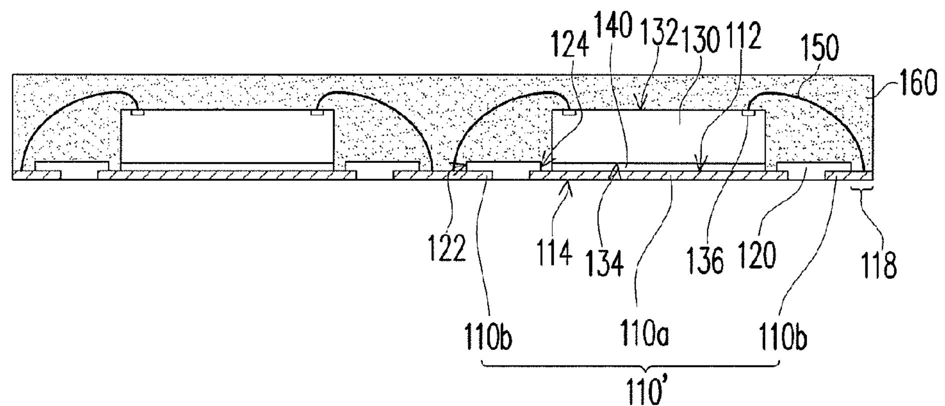

Referring to FIG. 1E, a molding compound 160 encapsulating the patterned conductive layer 110', the patterned solder resist layer 120, the chip 130 and the bonding wires 150 is formed. The material of the molding compound 160 is, for example, epoxy resin.

Figure 1F:
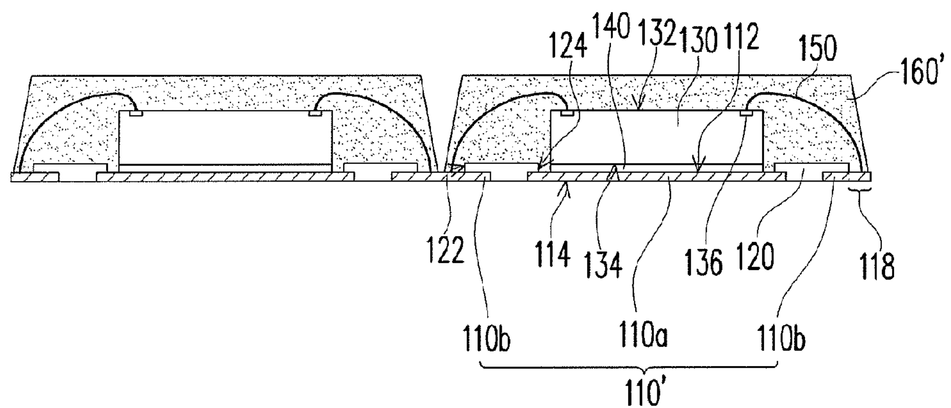

Referring to FIG. 1F, instead of forming a molding compound 160 encapsulating the patterned conductive layer 110', the patterned solder resist layer 120, the chip 130 and the bonding wires 150, a plurality of molding compound 160' could be formed to encapsulate the patterned conductive layer 110', the patterned solder resist layer 120, the chip 130 and the bonding wires 150.

Figure 1G:
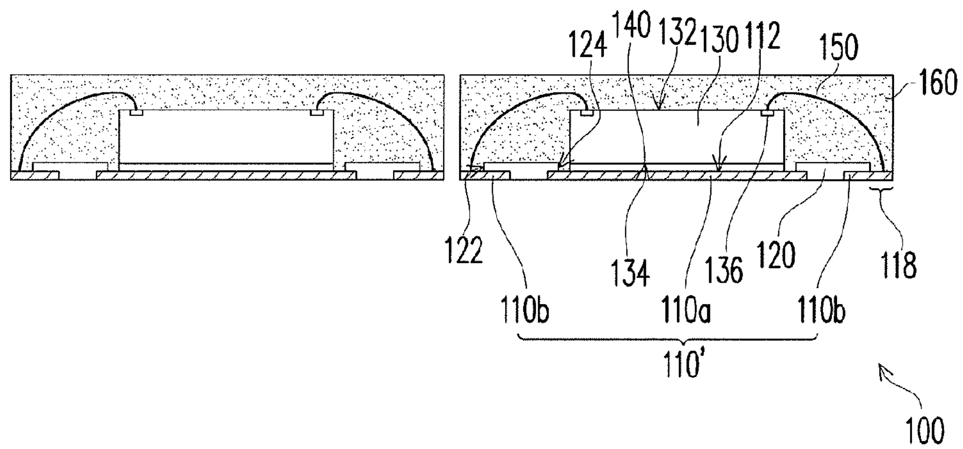
Figure 1H:
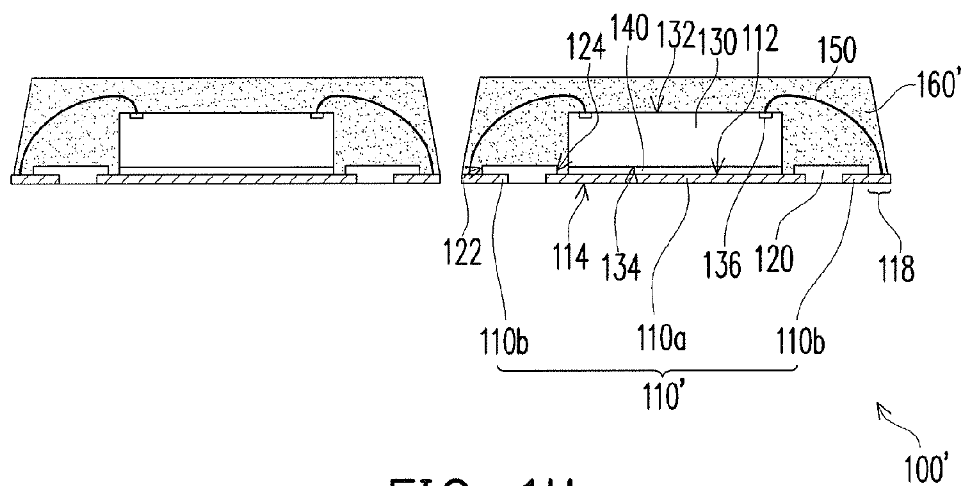

Referring to FIG. 1G and FIG. 1H, a singulation process is performed for forming a plurality of QFN chip packages 100 (shown in FIG. 1G) or a plurality of QFN chip packages 100' (shown in FIG. 1H), wherein the singulation process comprises a punch process or a sawing process.

As shown in FIG. 1G, the QFN chip package 100 of the present invention mainly includes a patterned conductive layer 110', a patterned solder resist layer 120, a chip 130, a plurality of bonding wires 150 and a molding compound 160. The patterned conductive layer 110' has a first surface 112 and a second surface 114 opposite to each other, wherein the patterned conductive layer 110' has a die pad 110*a* and a plurality of leads 110*b* surrounding the die pad 110*a*, and the patterned solder resist layer 120 extends from the first surface 112 of the patterned conductive layer 110' to an area between the die pad 110*a* and the leads 110*b*. The patterned solder resist layer 120 is disposed on the first surface 112, wherein a part of the first surface 112 is exposed by the patterned solder resist layer 120. The chip 130 is disposed on the patterned conductive layer 110', wherein the patterned solder resist layer 120 and the chip 130 is at the same side of the patterned conductive layer 110'. The bonding wires 150 are electrically connected to the chip 130 and the patterned conductive layer 110' exposed by the patterned solder resist layer 120'. The molding compound 160 encapsulates the pattern conductive layer 110', the patterned solder resist layer 120, the chip 130 and the bonding wires 150.

Compared with the conventional manufacturing process for a QFN chip package structure, the manufacturing process of the present invention can produce the QFN chip package having a solder resist layer to enhance the structure strength of the QFN chip package, such that the thickness of the patterned conductive layer can be decreased. Additionally, the overall thickness of the QFN chip package is decreased and the production cost is lowered, such that the throughput is improved in the present invention.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing process for a Quad Flat Non-leaded (QFN) chip package structure, comprising:

providing a conductive layer having a plurality of recesses and a patterned solder resist layer on the conductive layer, wherein the patterned solder resist layer covers the recesses of the conductive layer;

removing a part of the conductive layer to form a patterned conductive layer;

bonding a plurality of chips onto the patterned conductive layer such that the patterned solder resist layer and the chips are at the same side of the patterned conductive layer;

electrically connecting the chips to the patterned conductive layer by a plurality of bonding wires, wherein the chips and the bonding wires are at the same side of the patterned conductive layer;

forming at least one molding compound to encapsulate the patterned conductive layer, the patterned solder resist layer, the chips and the bonding wires; and separating the molding compound and the patterned conductive layer.

2. The manufacturing process for a QFN chip package structure as claimed in claim 1, wherein a method for providing the conductive layer having a plurality of recesses and the patterned solder resist layer comprises:

providing a conductive layer having a plurality of recesses;

forming a solder resist layer on the conductive layer; and patterning the solder resist layer to form the patterned solder resist layer, wherein a part of the conductive layer is exposed by the patterned solder resist layer.

3. The manufacturing process for a QFN chip package structure as claimed in claim 1, wherein a plurality of die pads and a plurality of leads are formed on the patterned conductive layer.

4. The manufacturing process for a QFN chip package structure as claimed in claim 1, wherein a plurality of first openings and second openings are formed on the patterned solder resist layer, wherein a part of the patterned conductive layer are exposed by the first openings and the second openings.

5. The manufacturing process for a QFN chip package structure as claimed in claim 4, wherein the bonding wires are electrically connected to the patterned conductive layer through the first openings.

6. The manufacturing process for a QFN chip package structure as claimed in claim 4, wherein the chips are bonded onto the patterned conductive layer exposed by the second openings.

7. The manufacturing process for a QFN chip package structure as claimed in claim 1, further comprising forming an adhesive layer between the chips and the patterned conductive layer.

8. The manufacturing process for a QFN chip package structure as claimed in claim 7, wherein the adhesive layer is a B-staged adhesive layer.

9. The manufacturing process for a QFN chip package structure as claimed in claim 8, wherein the B-staged adhesive layer is formed on a rear surface of the chip in advance.

10. The manufacturing process for a QFN chip package structure as claimed in claim 8, wherein the B-staged adhesive layer is formed on the patterned conductive layer before the chip is attached on the patterned conductive layer.

11. The manufacturing process for a QFN chip package structure as claimed in claim 1, wherein the recesses are filled with the patterned solder resist layer.

12. The manufacturing process for a QFN chip package structure as claimed in claim 1, wherein the conductive layer has a first surface with the recesses and a second surface opposite to the first surface.

13. The manufacturing process for a QFN chip package structure as claimed in claim 12, wherein a method for removing a part of the conductive layer to form a patterned conductive layer comprises etching a part of the conductive layer from the second surface so as to expose the patterned solder resist layer.

14. The manufacturing process for a QFN chip package structure as claimed in claim 1, wherein the patterned solder resist layer is a B-staged layer.

15. The manufacturing process for a QFN chip package structure as claimed in claim 1, wherein the patterned solder resist layer is an epoxy molding compound.

16. The manufacturing process for a QFN chip package structure as claimed in claim 1, wherein a plurality of first openings are formed on the patterned solder resist layer, wherein a part of the patterned conductive layer are exposed by the first openings.

17. The manufacturing process for a QFN chip package structure as claimed in claim 16, wherein the chips are bonded onto the patterned solder resist layer.

18. The manufacturing process for a QFN chip package structure as claimed in claim 17, wherein the patterned solder resist layer is a B-staged layer.

19. The manufacturing process for a QFN chip package structure as claimed in claim 1, further comprising forming an adhesive layer between the chips and the patterned solder resist layer.

20. The manufacturing process for a QFN chip package structure as claimed in claim 19, wherein the adhesive layer is a B-staged adhesive layer.

21. The manufacturing process for a QFN chip package structure as claimed in claim 1, wherein a brown oxidation or a black oxidation process can further be performed on the conductive layer.

* * * * *